(12) United States Patent
Cheng et al.

(10) Patent No.: US 8,355,277 B2
(45) Date of Patent: Jan. 15, 2013

(54) BIASING CIRCUIT AND TECHNIQUE FOR SRAM DATA RETENTION

(75) Inventors: Hong-Chen Cheng, Hsinchu (TW); Chih-Chieh Chiu, Toufen (TW); Hsu-Shun Chen, Toufen (TW); Chung-Ji Lu, Fongyuan (TW); Cheng Hung Lee, Hsinchu (TW); Hung-Jen Liao, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 144 days.

(21) Appl. No.: 13/008,992

(22) Filed: Jan. 19, 2011

(65) Prior Publication Data

US 2012/0182792 A1    Jul. 19, 2012

(51) Int. Cl.
*G11C 11/413* (2006.01)
*G11C 5/14* (2006.01)
(52) U.S. Cl. ......... 365/154; 365/226; 365/228; 365/229
(58) Field of Classification Search .................. None
See application file for complete search history.

(56) References Cited

U.S. PATENT DOCUMENTS

| | | | | |
|---|---|---|---|---|
| 5,384,747 A | * | 1/1995 | Clohset | 365/226 |
| 6,147,916 A | * | 11/2000 | Ogura | 365/203 |
| 7,307,907 B2 | * | 12/2007 | Houston | 365/222 |
| 7,643,368 B2 | * | 1/2010 | Choi et al. | 365/227 |

OTHER PUBLICATIONS

Calhoun, B.H. et al., "Static Noise Margin Variation for Sub-threshold Sram in 65-nm CMOS", IEEE Journal of Solid-State Circuits, Jul. 2006, 41(7):1673-1679.

* cited by examiner

*Primary Examiner* — Tan T. Nguyen
(74) *Attorney, Agent, or Firm* — Duane Morris LLP (57) ABSTRACT

A SRAM system includes: a SRAM cell array coupled between high and low supply nodes, a difference therebetween defining a data retention voltage (VDR) for a low power data retention mode; a main power switch coupling one of high and low supply nodes to a main power supply and disconnecting the one high and low supply nodes from the main power supply during the low power data retention mode; a monitor cell including a SRAM cell preloaded with a data bit and configured for data destruction responsive to a reduction in VDR before data destruction occurs in the SRAM cell array; and a clamping power switch responsive to data destruction in the monitor cell to couple the one of the high and low supply nodes to the main power supply.

20 Claims, 7 Drawing Sheets

FIG. 1

(PRIOR ART)

BIASING CIRCUIT AND TECHNIQUE FOR SRAM DATA RETENTION

TECHNICAL FIELD

The present invention relates to memory cells and techniques for data retention in those memory cells, and more particularly to data retention techniques for static random access memories (SRAM).

BACKGROUND

Static random access memory (SRAM) is a type of semiconductor memory that does not need to be refreshed (i.e., it is "static") because it uses bistable latch circuitry to store each bit. The memory is still "volatile" in the sense that data is eventually lost when the memory is not powered.

SRAMs constitute a significant percentage of the total area for many digital chips as well as the total power consumption. One manner of reducing the leakage power is to reduce the power supply node voltage of the SRAM during a lower power data retention or standby mode. In prior art solutions, a diode connected MOS transistor provides a voltage drop (ΔV), which is around the threshold voltage of the diode connected MOS transistor, from the main power supply voltage during power down mode to provide a lower power supply voltage for the SRAM. However, variations in process and temperature can cause large variations in this voltage drop, which lead to flipping of a cells contents and thus destruction of the stored data. For this reason, a bias controlled device is generally used to ensure a safe data retaining voltage. This approach, however, may maintain the SRAM supply voltage at a level that is too high, and thus does not maximize power savings opportunities.

BRIEF DESCRIPTION OF THE DRAWINGS

The accompanying drawings illustrate preferred embodiments of the invention, as well as other information pertinent to the disclosure, in which.

DETAILED DESCRIPTION

This description of the exemplary embodiments is intended to be read in connection with the accompanying drawings, which are to be considered part of the entire written description. Terms concerning electrical attachments, coupling and the like, such as "connected" and "interconnected," refer to a relationship wherein structures communicate with one another either directly or indirectly through intervening structures, unless expressly described otherwise.

Figure 1:
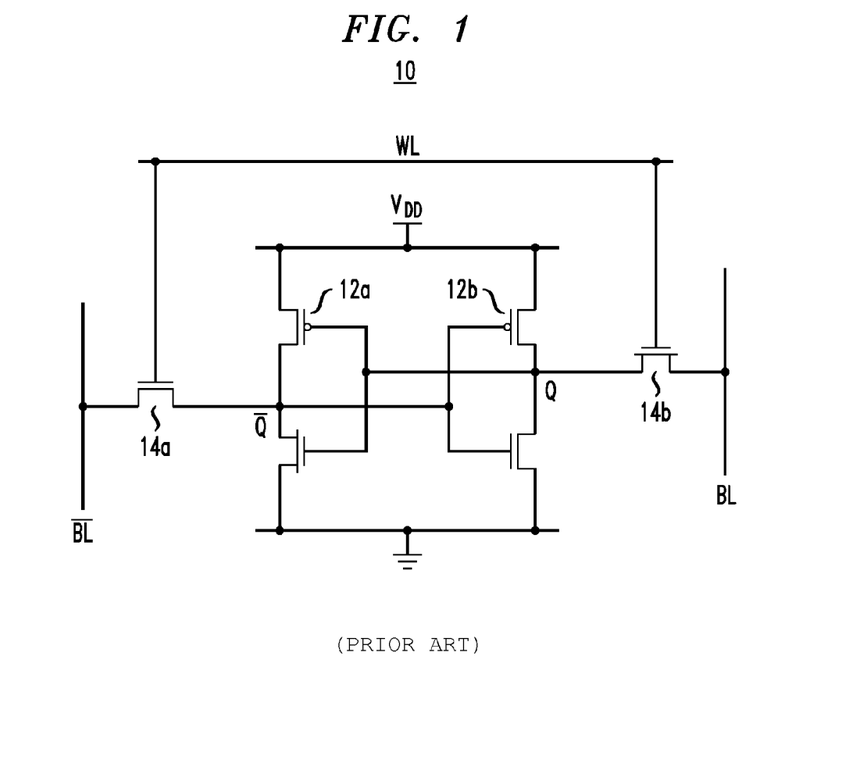
FIG. 1 is a circuit diagram of a conventional SRAM cell.

FIG. 1 is a circuit diagram of a conventional SRAM cell 10. As will be readily familiar, the SRAM cell 10 includes a pair of cross-coupled inverters 12a, 12b forming a data retention latch and a pair of access transistors 14a, 14b. The storage cell 10 has two stable states which are used to denote logical 0 and 1. The access transistors serve to control access to the storage cell 10 during read and write operations. A typical cell 10 uses six transistors, as illustrated in FIG. 1, though designs of eight, ten or more transistors exist for implementing more than one read and/or write port. If the word line is not asserted, the access transistors 14a, 14b disconnect the cell 10 from the bit lines. The pair of cross-coupled inverters 12a, 12b retain the stored data states as long as they are connected to a sufficient power supply. The inverters 12a, 12b must maintain bistable operating points, and the measure of this ability is known as the cell's static noise margin (SNM). The SNM is the maximum amount of voltage noise that can be introduced at the outputs of the two inverters 12a, 12b such that the cell 10 retains its data. Put another way, the SNM quantifies the amount of voltage noise required to flip the cell's data contents.

As described in detail below, an approach is presented for generating the proper voltage for preservation of SRAM data during the power saving mode. The power saving mode is used to reduce the leakage current of the SRAM memory through lowering the SRAM supply voltage without risking data destruction. In embodiments, the proper data retention voltage is created by tracking SRAM cell static noise margin (SNM), which allows for compensating for SRAM process and temperature variations.

Figure 2:
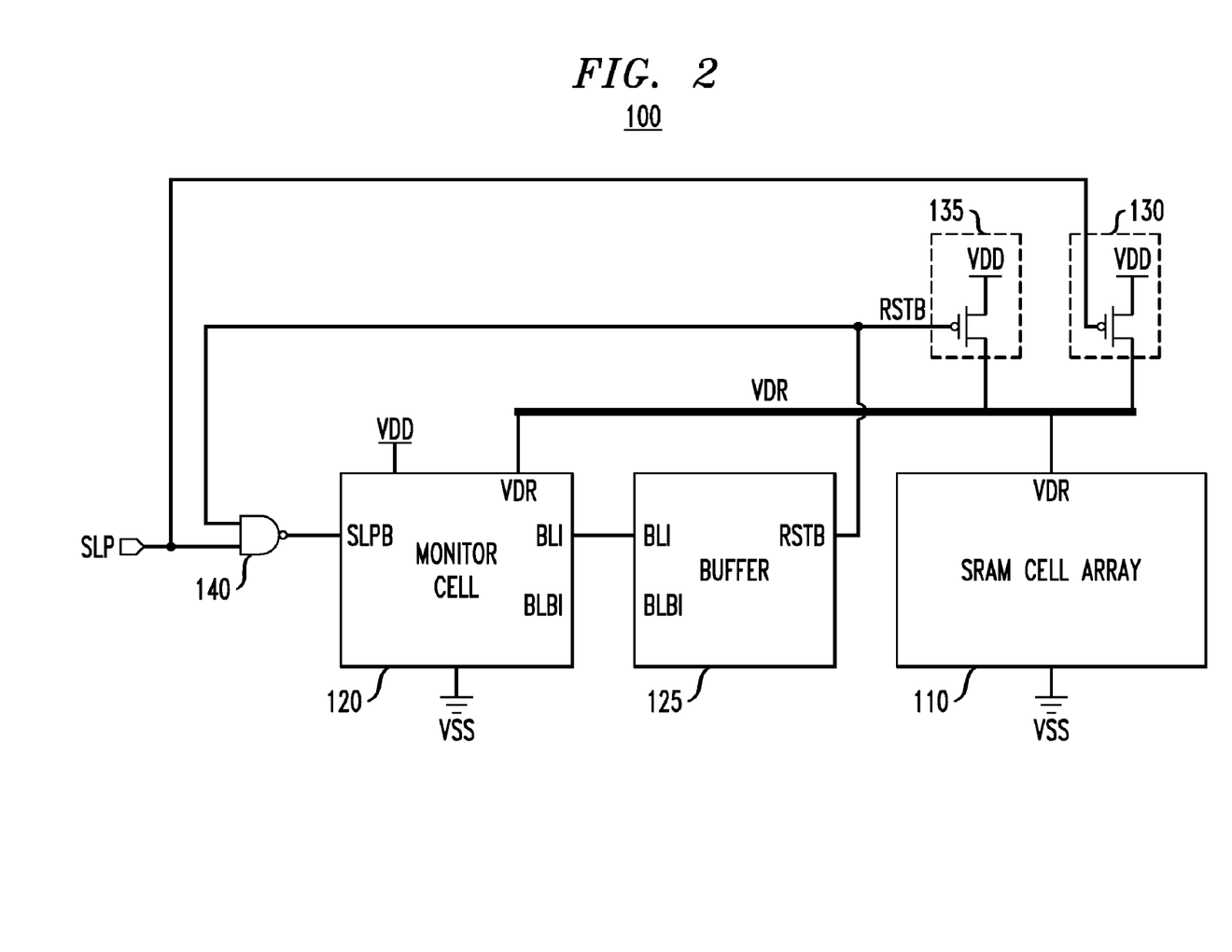
FIG. 2 is a schematic illustration of an embodiment of a SRAM memory system with dynamic data retention voltage adjustment.

FIG. 2 is a schematic illustration of an embodiment of a SRAM memory system 100 which employs dynamic data retention voltage adjustment through tracking of SRAM cell SNM. The system 100 includes a SRAM cell array 110 of conventional design. As will be understood, the SRAM cell array 110 includes a matrix (i.e., plurality of rows and columns) of SRAM memory cells, such as the cell 10 shown in FIG. 1. The SRAM cell array is coupled between two power supply rails, with the low power supply rail labeled VSS and the high power supply rail labeled VDR for "data retention voltage". The system 100 also includes SRAM monitoring cell 120, a control circuit, shown as buffer 125, main power switch 130, clamping power switch 135 and NAND gate 140.

The main power switch 130 is controlled directly by sleep (i.e., power down) control signal SLP. In embodiments, main power switch 130 is a PMOS transistor coupled between main power supply VDD and the VDR power supply node. The gate terminal of the PMOS is coupled to control signal SLP, which is high during power down data retention mode and low during normal operating mode. When SLP is low, main power switch 130 is on, which connects the VDR node to high main supply VDD. The SRAM cell array 110 is thus connected to the main power supply VDD during normal operating mode.

The clamping power switch 135 is controlled by the buffer output RSTB from buffer 125, which is described in more detail below. In embodiments, the clamping power switch 135 is a PMOS transistor, meaning the clamping circuit is on when RSTB is low and off when RSTB is high. NAND gate 140 has as inputs control signal SLP and RSTB and provides output SLPB to monitor cell 120. Monitor cell 120 also has VDR as an input. During power savings mode (i.e., when SLP is logical high), SLPB is logical high when RSTB is logical low and SLPB is logical low when RSTB is logical high. The monitor cell 120 monitors the level of VDR and outputs BLI to the buffer 125. BLI represents the sensing output of the monitor cell 120 and is used, through buffer 125, to trigger clamping power switch 135 to turn on, which clamps VDR to main power supply voltage VDD, before VDR dips to a level where data within SRAM cell array 110 is compromised. This operation is described in more detail below in connection with FIG. 3.

Figure 3:
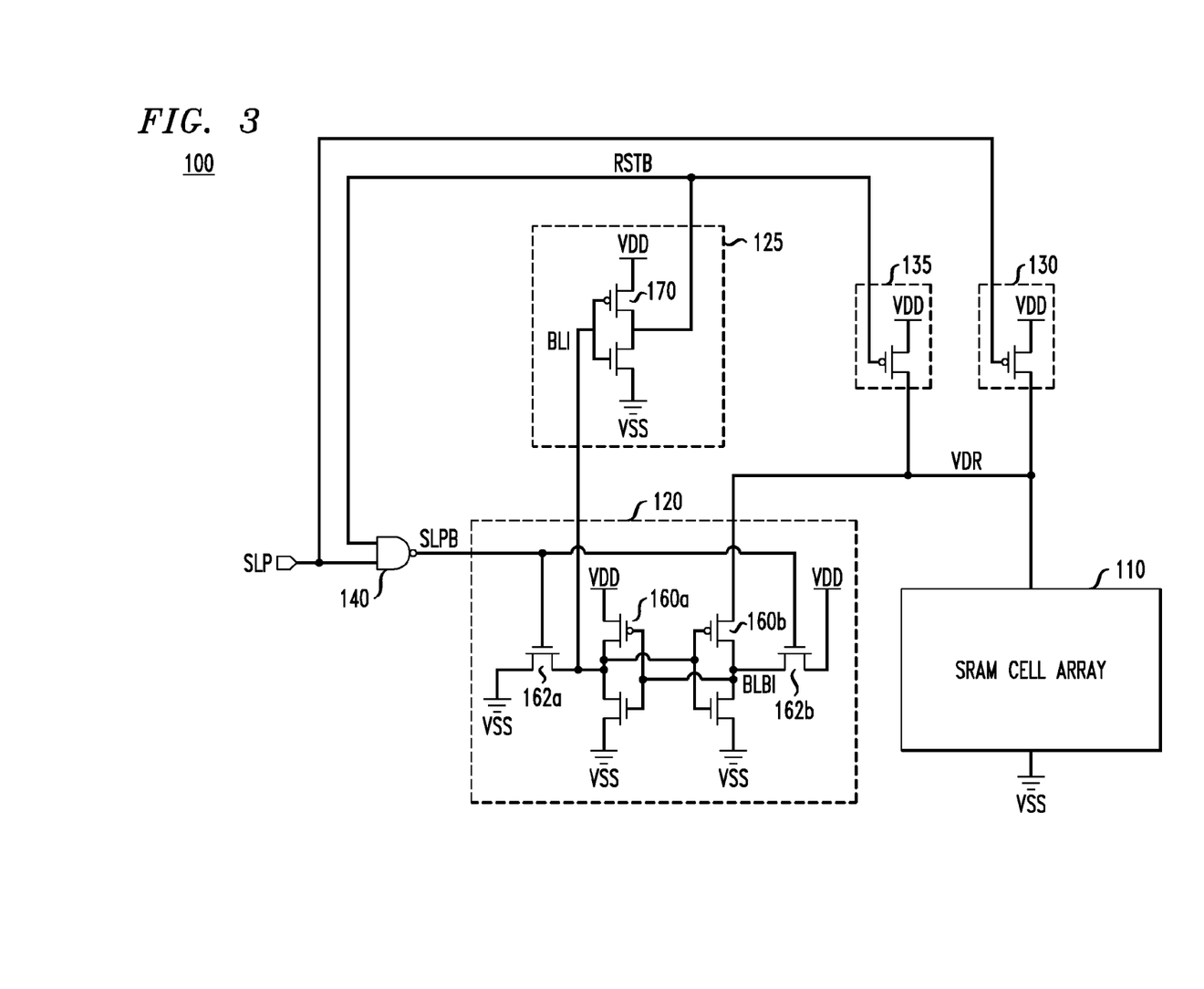
FIG. 3 is a more detailed illustration of the SRAM memory system of FIG. 2.

FIG. 3 is a more detailed view of the SRAM memory system 110. Specifically, embodiments of monitor cell 120 and buffer 125 are shown in more detail. Monitor cell 120 includes a SRAM cell formed from a pair of cross-coupled inverters 160a and 160b and having access transistors 162a, 162b. Rather than being connected to bit lines, the access transistors 162a, 162b are coupled between output node BLI and supply node VSS, and between complementary output node BLBI (also referred to as data bar output) and supply node VDD, respectively. Of particular note, the inverters 160a and 160b are asymmetrically biased. That is, inverter 160b, which provides output BLBI, is coupled between supply node VDR and VSS whereas inverter 160a, which provides output BLI, is coupled between supply node VDD and VSS.

Turning to buffer 125, in one embodiment the buffer includes inverter 170 coupled between main supply nodes VDD and VSS. The input to inverter 170 is the output BLI of inverter 160a of monitor cell 120. The output of inverter 170 is control signal RSTB, which is provided to clamping power switch 135 and NAND gate 140.

Figure 4:
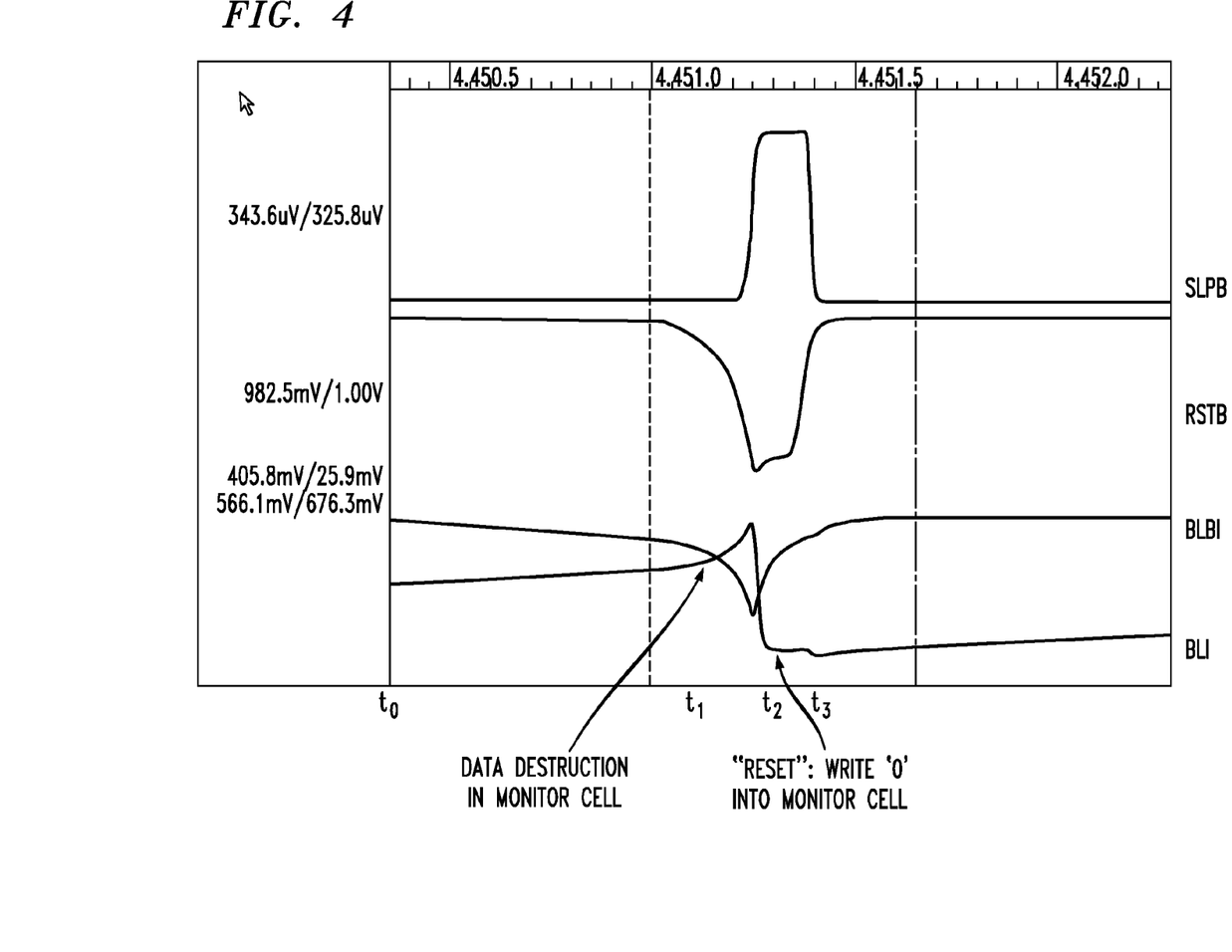
FIG. 4 is a timing diagram illustrating the operation of the SRAM memory system of FIGS. 2 and 3.

FIG. 4 is a timing diagram illustrating the operation of the SRAM memory system 100. With references to both FIGS. 3 and 4, before power savings mode, SLP is a logical 0, meaning SLPB is a logical 1. With SLPB at logical 1, a bit corresponding to logical 0 is preloaded into the monitor cell 120.

At time t0, the system enters power savings mode. Sleep control signal SLP goes high. With a logical 0 already stored in the monitor cell 120, output BLI is logical 0 and complementary output BLBI is logical 1. The output of inverter 170 of buffer 125 is logical 1. As such, RSTB is logical 1, which means that clamping power switch 135 is off. Also, with SLP at logical 1, main power switch 130 is off. The retention voltage for SRAM cell array 110 at node VDR starts to decay from VDD toward the SNM voltage of the SRAM cell array 110, i.e., toward a voltage level at which data will be lost in the SRAM cell array 110. With both RSTB and SLP at logical 1, SLPB is a logic 0, which turns off access transistors 162a, 162b.

Since the PMOS of inverter 160b is coupled to VDR, the level of BLBI decreases with VDR. As VDR decays, the ability of BLBI to drive inverter 160a decreases. Eventually, at time t1, the VDR voltage level reaches a point at which output BLBI can no longer drive inverter 160a, specifically the NMOS of inverter 160a, to maintain output BLI low. The PMOS transistor of inverter 160a turns on when its threshold voltage (Vth) is exceeded and drives the output of inverter 160a to a logical high (VDD), meaning the data within the monitor cell has flipped. With BLI at a logic high, RSTB switches from high to low. With RSTB low, clamping power switch 135 turns on and clamps VDR to VDD to pull VDR up to VDD. Also with RSTB at logic level 0, the output SLPB of NAND 140 switches from low to high, which turns on access transistors 162a and 162b. This has the effect at time t2 of resetting the monitor cell 120 to rewrite data bit 0 into the cell. With data bit 0 stored in the monitor cell 120, at time t3, BLI goes low again, RSTB goes high, turning off the power clamp circuit 135, and SLPB goes low, turning off access transistors 162a, 162b. With the power clamp circuit 135 off, VDR is again free to decay from VDD toward the SNM voltage of the SRAM cell array 110.

It is critical that the monitor cell data flips before the data within the SRAM cell array 110. That is, the monitor cell 120 should be configured to have a lower static noise margin (SNM) than that of the SRAM cells in the main SRAM cell array 110 such that data is destroyed in the SRAM monitor cell 120 before data is lost in the SRAM cell array 110 due to reductions in the data retention voltage VDR. Compliance with this condition ensures that the clamp circuit 135 is turned on before data is corrupted within the SRAM cell array 110. The system 100 can be designed in several ways to ensure that the monitor cell 120 flips before the cells in the SRAM cell array 110.

One approach to making the monitor cell 120 flip before the functional cells in the SRAM cell array 110 is to make the threshold voltage (Vth) of the PMOS transistor of the inverter 160a less than the threshold voltage (Vth) of the corresponding PMOS transistors of the cross-latched inverters in the functional SRAM cell array 110. For example, in one embodiment, the PMOS of the inverter 160a could be forward biased to lower its threshold, such as by tying the bulk to VDR. With this arrangements, the Vth of the two PMOS from inverters 160a, 160b becomes unbalanced and it is easier to flip the BLI output. That is, the PMOS of inverter 160a is powered by VDD but its gate (from the output of inverter 160b) is powered by VDR since BLBI takes on the value of VDR. When the difference between VDD and VDR exceeds the threshold voltage of the PMOS of inverter 160a, output BLI will go high and BLBI is pulled low.

While the embodiment of FIG. 3 has been described in connection with the combination of asymmetrically powering inverters 160a and 160b and with the PMOS 160a of inverter 160a having a threshold voltage less than the threshold voltage of corresponding transistors from the main cell array 110, it should be understood that other combinations may be employed to ensure that the data within the monitor cell 120 flips in response to VDR before data is lost within main SRAM cell array 110.

In an alternative embodiment, both inverters 160a, 160b could be powered from VDR. In this embodiment, the source terminals of the PMOS from both inverters 160a, 160b are coupled to VDR and have threshold voltages (Vth) less than those of the corresponding PMOS transistors from the inverters of the SRAM cell array 110. With this configuration, the monitor cell will flip earlier than the functional memory cell array and trigger RSTB.

It should be understood that regardless of the approach to making the monitor cell data flip before that of the SRAM cell array 110, the design goal is to achieve the lowest VDR before engaging the clamping circuit, for maximum leakage reduction, while avoiding data destruction in the main SRAM memory array 110.

It should be readily apparent that while BLI is used in FIG. 3 to drive signal RSTB, BLBI may alternatively be used in embodiments with only minor modifications to the circuit shown in FIG. 3 that should be apparent to one of ordinary skill in the art. Further, one of ordinary skill in the art will understand that NMOS transistors could be substituted for the PMOS transistors 130, 135 shown in FIG. 3 with appropriate circuit modifications, which should also apparent to those familiar with the design of such circuits.

Figure 5:
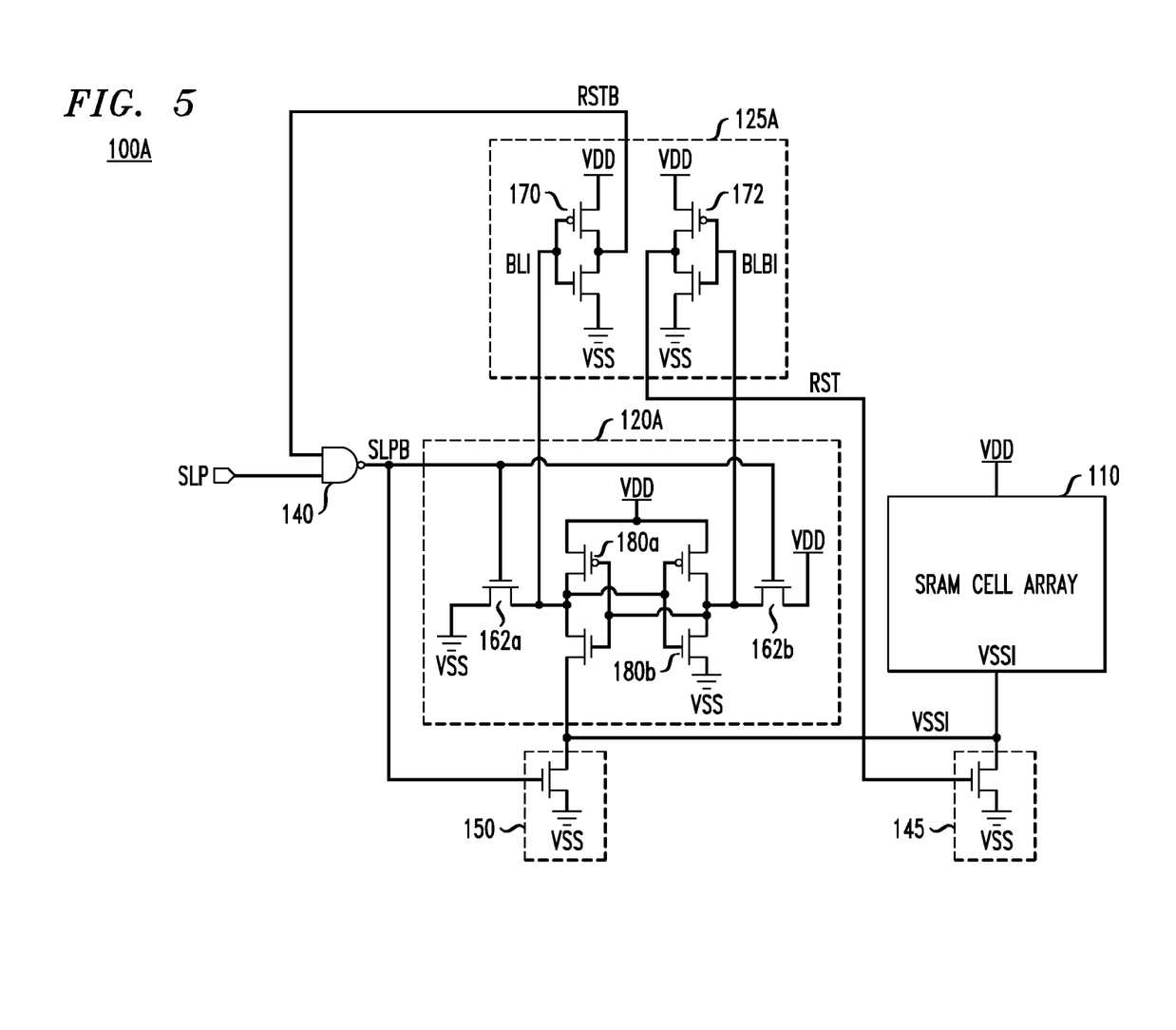
FIG. 5 illustrates an alternative embodiment of a SRAM memory system with dynamic data retention voltage adjustment.

FIG. 5 illustrates an alternative embodiment of a SRAM memory system 100A with dynamic data retention voltage adjustment. SRAM memory system 100A is identical to memory system 100 of FIG. 5 except for modifications to monitor cell 120A, buffer 125 and replacement of power switch 130 with switch 150 and clamping power switch 135 with clamping power switch 145, respectively. SRAM cell array 110 is coupled between high power supply node VDD and low power supply node VSSI. In this embodiment, during normal operation mode, switch 150 is on and VSSI is connected to VSS. The data retention voltage VDR is defined by the difference between VDD and VSSI.

As can be seen from FIG. 5, monitor cell 120A includes cross-coupled inverters 180a, 180b rather than inverters 160a, 160b. Inverter 180a is coupled between VDD and VSSI whereas inverter 180b is coupled between VDD and VSS. The monitor cell 120A is designed such that BLBI/BLI flip before data is corrupted in the SRAM cell array. Similar to the embodiment illustrated in FIG. 3, either of the transistors of inverter 180b could be configured to have a lower threshold voltage than its corresponding transistor from the SRAM cell array to ensure data flips in the monitor cell 120A before data is corrupted in the SRAM cell array 110.

Once the power savings mode begins, both NMOS 145 and NMOS 150 are off. With both NMOSs off, the voltage of VSSI will begin to rise, which lowers the data retention voltage VDR (i.e., the difference between VDD and VSSI). At the same time, BLBI is high, so the NMOS of inverter 180a, which gate is coupled to BLBI, is on. Therefore, the level of BLI raises as VSSI raises until BLI and BLBI flip, meaning the data of the monitor cell 120A has flipped.

In addition to inverter 170, buffer 125 also includes inverter 172 which inverts complementary output BLBI to provide control signal RST. Signal RST from buffer 125A goes from low to high, which turns on clamping power switch 145 and ties VSSI to VSS. Signal RSTB from inverter 170 is again used to trigger a rewrite of the data into the monitor cell 120A, which causes RSTB to switch, turning off access transistors 162a, 162b, and causes RST to switch, turning off clamping power switch 145.

Figure 6:
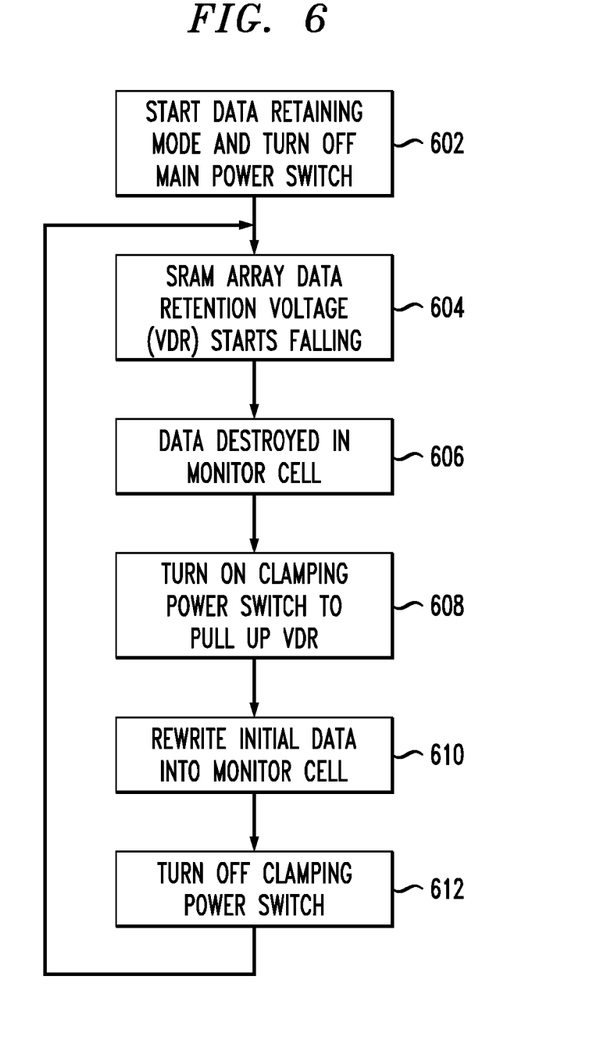
FIG. 6 is a flow chart illustrating the operation of an embodiment of a SRAM memory system during power savings mode.

FIG. 6 is a flow chart illustrating the operation of an embodiment of a SRAM memory system during low power data retention power savings mode. At step 602, the data retaining/power savings mode is started and the main power switch (i.e. switch 130) is turned off. This causes SRAM array data retention voltage VDR to start falling (step 604). Eventually, when VDR is low enough, data is destroyed in the monitor cell (i.e., monitor cell 120) at step 606. The data destruction causes the clamping power switch (i.e., switch 135) to be turned on, which pulls VDR up to VDD (step 608). The initial data is then rewritten into the monitor cell (step 610) and the clamping power switch is turned off (step 612). The method then returns to step 604.

Figure 7:
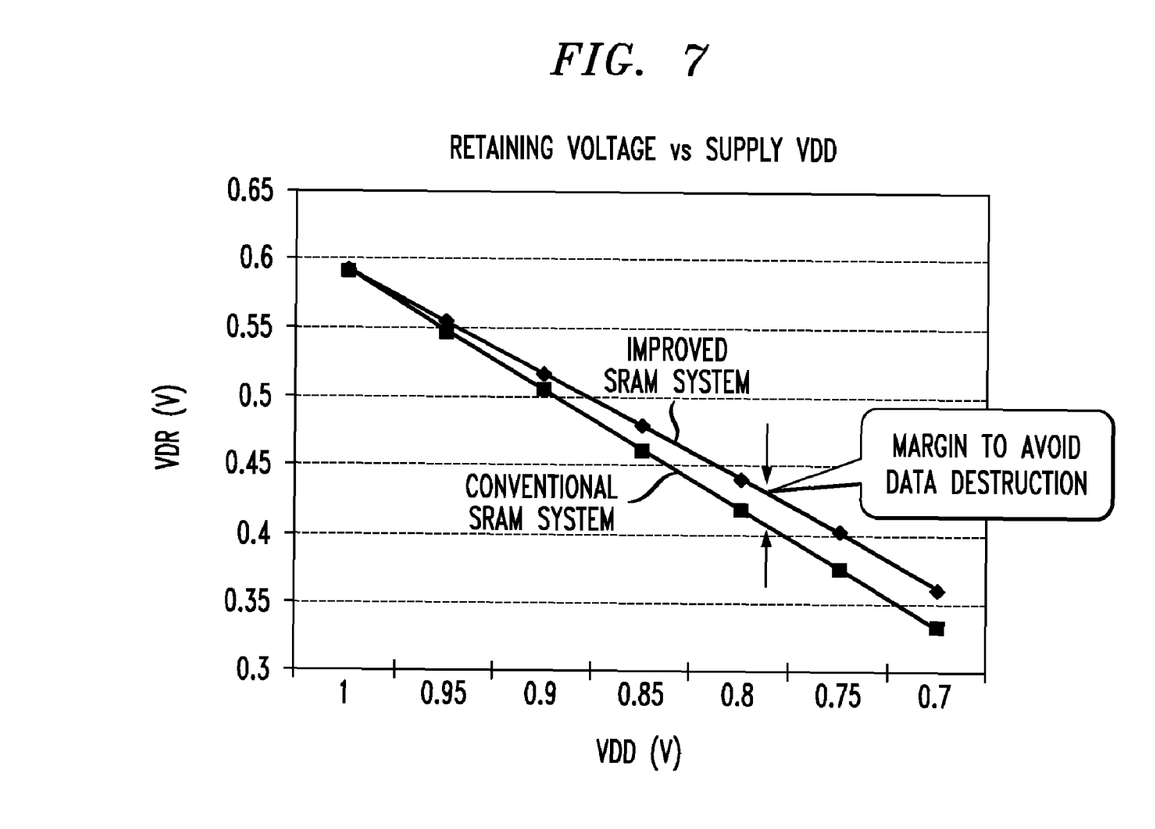
FIG. 7 illustrates simulation results comparing performance of a conventional SRAM memory system and an embodiment of the SRAM memory system disclosed herein.

FIG. 7 illustrates simulation results comparing performance of a conventional SRAM memory system and an embodiment of the SRAM memory system disclosed herein. More specifically, FIG. 7 plots data retention voltage (VDR) versus supply voltage (VDD). As shown in FIG. 7, the slope of the plot with the improved SRAM memory system is less than that of a conventional system. So, for a given VDD value, the retention voltage of the improved system is higher than that of the conventional system, which shows higher supply noise immunity by dynamic monitoring of the retention voltage through tracking SRAM SNM to achieve maximum leakage reduction and illustrates larger noise immunity margin than conventional systems as VDD goes lower.

Per the foregoing, in one embodiment of a SRAM system configured to operate in a low power data retention mode, the system includes: a SRAM cell array coupled between high and low supply nodes, a difference between voltages at the supply nodes defining a data retention voltage during the low power data retention mode; a main power switch coupling one of high and low supply nodes to a main power supply, the main power switch disconnecting the one of the high and low supply nodes from the main power supply during the low power data retention mode; a monitor cell, the monitor cell including a SRAM cell preloaded with a data bit and configured for data destruction responsive to a reduction in the data retention voltage before data destruction occurs in the SRAM cell array due to the reduction in the data retention voltage; and a clamping power switch responsive to data destruction in the monitor cell to couple the one of the high and low supply nodes to the main power supply.

A circuit for generating a data retention voltage for preservation of data in a SRAM array during a low power data retention mode is also provided. The circuit includes a monitoring cell comprising a SRAM cell, the SRAM cell receiving a data retention voltage during the low power data retention mode for retaining a preloaded data bit in the SRAM cell; and a clamping power switch, the clamping power switch responsive to a change in the preloaded data bit of the monitor cell to pull the data retention voltage up to a predetermined data retention voltage, wherein the SRAM cell is configured with a lower static noise margin (SNM) than SRAM cells in the SRAM array such that data is destroyed in the SRAM cell before data is destroyed in the SRAM array from reductions in the data retention voltage.

A method of maintaining a data retention voltage for preservation of data in a SRAM array during a low power data retention mode is also provided. In embodiments, the method includes the following steps: (a) providing a monitoring cell comprising a SRAM cell, the SRAM cell receiving a data retention voltage during the low power data retention mode for retaining a preloaded data bit in the SRAM cell; (b) loading the data bit into the SRAM cell; (c) disconnecting the SRAM array from a main power supply after entering a low power data retention mode; (d) monitoring the SRAM cell to detect destruction of the data bit in the SRAM cell; and (e) in response to the detection of the destruction of the data bit, pulling the data retention voltage up to a predetermined data retention voltage, wherein the SRAM cell is configured with a lower static noise margin (SNM) than SRAM cells in the SRAM array such that data is destroyed in the SRAM cell before data is destroyed in the SRAM array from reductions in the data retention voltage.

In further embodiments, the method also includes the following steps: (f) rewriting the data bit into the SRAM cell after detecting the destruction of the data bit; (g) stopping pulling the data retention voltage up to the predetermined data retention voltage; and (h) repeating steps (d) to (g).

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A static random access memory (SRAM) system configured to operate in a low power data retention mode comprising:
a SRAM cell array coupled between high and low supply nodes, a difference between voltages at the supply nodes defining a data retention voltage during the low power data retention mode;
a main power switch coupling one of high and low supply nodes to a main power supply, the main power switch disconnecting the one of the high and low supply nodes from the main power supply during the low power data retention mode;

a monitor cell, the monitor cell including a SRAM cell preloaded with a data bit and configured for data destruction responsive to a reduction in the data retention voltage before data destruction occurs in the SRAM cell array due to the reduction in the data retention voltage; and a clamping power switch responsive to data destruction in the monitor cell to couple the one of the high and low supply nodes to the main power supply.

2. The SRAM system of claim 1, wherein:
the main power supply is a high power supply (VDD), and
the main power switch and clamping power switch are coupled between the high power supply (VDD) and the high supply node.

3. The SRAM system of claim 1, wherein:
the main power supply is a low power supply (VSS), and
the main power switch and clamping power switch are coupled between the low power supply (VSS) and the low supply node.

4. The SRAM system of claim 1, wherein the monitor cell comprises a SRAM cell comprising asymmetrically biased cross-coupled inverters, the inverters have data and data bar inputs and outputs, the system further comprising a buffer circuit coupled between an output of the monitor cell and the clamping power switch.

5. The SRAM system of claim 4, wherein the monitor cell further comprises first and second access transistors coupled to the data and data bar inputs, respectively, of the SRAM cell, wherein the access transistors are responsive to a data reset control signal to rewrite the preloaded data bit into the monitor cell after data destruction.

6. The SRAM system of claim 5, wherein the buffer includes a first inverter having an input coupled to the data output of the monitor cell and an inverter output, the system further comprising an input gate having a first input coupled to a low power data retention mode control signal; a second input coupled to the inverter output of the buffer; and an output corresponding to the data reset control signal.

7. The SRAM system of claim 6, wherein the input gate is a NAND gate.

8. The SRAM system of claim 1,
wherein the main power supply is a high power supply (VDD), and the main power switch and clamping power switch are coupled between the high power supply (VDD) and the high supply node,
wherein the monitor cell comprises a SRAM cell comprising a pair of cross-coupled inverters, the inverters having data and data bar inputs and outputs, a first one of the pair of cross-coupled inverters being coupled between the high power supply (VDD) and a low power supply (VSS), and a second one of the pair of cross-coupled inverters being coupled between the high supply node and the low power supply (VSS).

9. The SRAM system of claim 8, further comprising a buffer circuit comprising an inverter, the inverter having an input coupled to the data output of the monitor cell and an output, wherein the output of the inverter is coupled to the clamping power switch.

10. The SRAM system of claim 9,
wherein the monitor cell further comprises first and second access transistors coupled to the data and data bar inputs, respectively, of the SRAM cell, wherein the access transistors are responsive to a data reset control signal to rewrite the preloaded data bit into the monitor cell after data destruction, the SRAM system further comprising an input NAND gate having a first input coupled to a low power data retention mode control signal; a second input coupled to the output of the inverter of the buffer; and an output corresponding to the data reset control signal.

11. The SRAM system of claim 1,
wherein the main power supply is a low power supply (VSS), and the main power switch and clamping power switch are coupled between the low power supply (VSS) and the low supply node, and
wherein the monitor cell comprises a SRAM cell comprising a pair of cross-coupled inverters, the inverters having data and data bar inputs and outputs, a first one of the pair of cross-coupled inverters being coupled between a high power supply (VDD) and the low supply node, and a second one of the pair of cross-coupled inverters being coupled between the high power supply (VDD) and the low power supply (VSS).

12. The SRAM system of claim 11,
wherein the control circuit comprises a buffer circuit having first and second inputs coupled to the data and data bar outputs, respectively, for the monitor cell and first and second inverted outputs corresponding to the first and second inputs of the buffer, wherein the second inverted output is coupled to the clamping power switch.

13. The SRAM system of claim 12,
wherein the monitor cell further comprises first and second access transistors coupled to the data and data bar input nodes, respectively, of the SRAM cell, wherein the access transistors are responsive to a data reset control signal to rewrite the preloaded data bit into the monitor cell after data destruction, the SRAM system further comprising an input NAND gate having a first input coupled to a low power data retention mode control signal; a second input coupled to the first inverted output of the buffer; and an output corresponding to the data reset control signal.

14. The SRAM system of claim 1, wherein:
the monitor cell comprises an SRAM cell comprising a pair of cross-coupled inverters, the inverters having data and data bar inputs and outputs, at least one of the inverters being biased between the high and low supply nodes, and at least one of the inverters comprising a transistor having a threshold voltage lower than a threshold voltage of a corresponding transistor within the SRAM cell array.

15. A circuit for generating a data retention voltage for preservation of data in a static random access memory (SRAM) array during a low power data retention mode, comprising:

a monitoring cell comprising a SRAM cell, the SRAM cell receiving a data retention voltage during the low power data retention mode for retaining a preloaded data bit in the SRAM cell; and a clamping power switch, the clamping power switch responsive to a change in the preloaded data bit of the monitor cell to pull the data retention voltage up to a predetermined data retention voltage, wherein the SRAM cell is configured with a lower static noise margin (SNM) than SRAM cells in the SRAM array such that data is destroyed in the SRAM cell before data is destroyed in the SRAM array from reductions in the data retention voltage.

16. The circuit of claim 15, further comprising means for rewriting the preloaded data bit into the SRAM cell after the change in the preloaded data bit.

17. The circuit of claim 16, wherein the SRAM cell comprises at least one transistor having a threshold voltage lower than a corresponding transistor from SRAM cells within the SRAM array.

18. The circuit of claim 15, further comprising a buffer circuit comprising an inverter having an input coupled to an output of the monitor cell and an output coupled to the clamping power switch.

19. A method of maintaining a data retention voltage for preservation of data in a static random access memory (SRAM) array during a low power data retention mode, comprising:
  (a) providing a monitoring cell comprising a SRAM cell, the SRAM cell receiving a data retention voltage during the low power data retention mode for retaining a preloaded data bit in the SRAM cell;
  (b) loading the data bit into the SRAM cell;
  (c) disconnecting the SRAM array from a main power supply after entering a low power data retention mode;
  (d) monitoring the SRAM cell to detect destruction of the data bit in the SRAM cell; and
  (e) in response to the detection of the destruction of the data bit, pulling the data retention voltage up to a predetermined data retention voltage,
  wherein the SRAM cell is configured with a lower static noise margin (SNM) than SRAM cells in the SRAM array such that data is destroyed in the SRAM cell before data is destroyed in the SRAM array from reductions in the data retention voltage.

20. The method of claim 19, further comprising the steps of:
  (f) rewriting the data bit into the SRAM cell after detecting the destruction of the data bit;
  (g) stopping pulling the data retention voltage up to the predetermined data retention voltage; and
  (h) repeating steps (d) to (g).

\* \* \* \* \*